(12) United States Patent
Momose

(10) Patent No.: US 9,888,596 B2
(45) Date of Patent: Feb. 6, 2018

(54) POWER CONVERTER INCORPORATED IN CASE

(71) Applicant: Denso Corporation, Kariya, Aichi-pref. (JP)

(72) Inventor: Taijirou Momose, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/163,093

(22) Filed: May 24, 2016

(65) Prior Publication Data

US 2016/0352215 A1 Dec. 1, 2016

(30) Foreign Application Priority Data

May 26, 2015 (JP) ................................. 2015-106512

(51) Int. Cl.

| H05K 7/14 | (2006.01) |
|---|---|
| H05K 5/02 | (2006.01) |
| B60L 11/18 | (2006.01) |
| H05K 1/14 | (2006.01) |
| H05K 3/36 | (2006.01) |
| H05K 3/34 | (2006.01) |

(52) U.S. Cl.
CPC ............ *H05K 5/0239* (2013.01); *B60L 11/18* (2013.01); *H05K 1/144* (2013.01); *H05K 3/368* (2013.01); *H05K 7/1432* (2013.01); *H05K 3/3447* (2013.01); *H05K 2201/042* (2013.01); *H05K 2201/09127* (2013.01); *H05K 2201/1084* (2013.01); *H05K 2201/10318* (2013.01); *H05K 2201/10833* (2013.01)

(58) Field of Classification Search
CPC .... H05K 5/0239; H05K 51/144; H05K 3/368; H05K 7/1432; H05K 3/3447; H05K 2201/042; H05K 2201/09127; H05K 2201/10318; H05K 2201/10833; H05K 2201/1084; B06L 11/18
USPC .......................... 361/728–730, 752, 796, 800
See application file for complete search history.

(56) References Cited

U.S. PATENT DOCUMENTS

| 3,866,998 | A | * | 2/1975 | Iantorno | ................. | H01R 13/41 411/43 |
| 4,934,941 | A | * | 6/1990 | Okada | ................... | H05K 7/1457 439/60 |
| 7,766,663 | B2 | * | 8/2010 | Yazawa | ................. | H01R 12/716 439/63 |
| 8,422,235 | B2 | * | 4/2013 | Azuma | ................... | B60K 6/445 361/688 |
| 9,485,880 | B2 | * | 11/2016 | Jeong | .................... | H05K 5/0047 |
| 2008/0293264 | A1 | * | 11/2008 | Trout | .................... | H01R 13/633 439/74 |

FOREIGN PATENT DOCUMENTS

| JP | 11-176479 | * | 7/1999 | ............ H01M 10/42 |
| JP | 2012-248415 A | | 12/2012 | |

* cited by examiner

*Primary Examiner* — Hung S Bui
(74) *Attorney, Agent, or Firm* — Oliff PLC

(57) ABSTRACT

A power converter includes a case body provided with a device main body part having a power conversion part accommodated therein, a lid member covering an aperture of the case body, a first substrate fixed to the case body, a second substrate fixed to the lid member, the first substrate and the second substrate being fixed therein and a connection member electrically connecting the first substrate and the second substrate.

13 Claims, 7 Drawing Sheets

FIG. 7
(A)
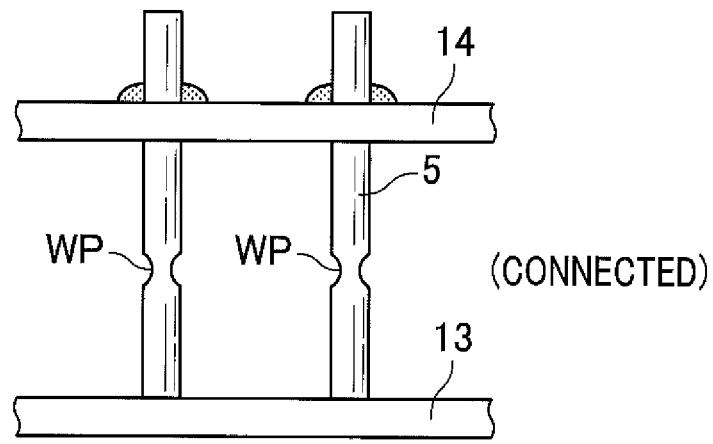
(CONNECTED)
(B)
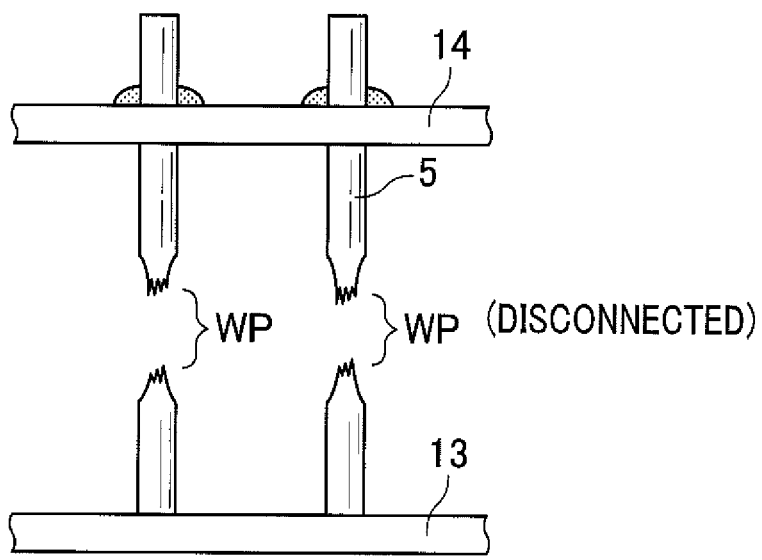
(DISCONNECTED)

POWER CONVERTER INCORPORATED IN CASE

CROSS-REFERENCE TO RELATED APPLICATION

This application is based on and claims the benefit of priority from earlier Japanese Patent Application No. 2015-106512 filed May 26, 2015 the description of which are incorporated herein by reference.

BACKGROUND OF THE INVENTION

Technical Field

The present invention relates to a power converter for the power conversion, for example, of a direct current (DC) power to a direct current (DC) power or direct current (DC) power to an alternating current (AC) power. More specifically, the present invention relates to a power converter equipped with a case body having an aperture, in which power conversion parts are accommodated, and a lid member to cover the aperture of the case body.

Related Art

A power converter such as an inverter includes a device main body part having a power conversion part accommodated inside the case body. The case includes, for example, a case body provided with an aperture and a lid member to cover the aperture of the case body. In particular, the electronic device shown in the patent reference includes an interlocking-function provided between the case body and the lid member for security purposes. The interlocking function includes a standby connector provided on the case body and an interlock connector provided on the lid member. With this device, when the lid member is removed from the case body, the connection between the standby connector and the interlock-connector is released and the electric supply shut-off with the release of the interlock.

CITATION LIST

Patent Literature

[Patent Literature 1] Laid-open Patent Number 2012-248415

However, with the interlock function shown in the patent literature 1, it is necessary to provide a standby connector on the case body and an interlocking-connector on the lid member. In other words, it is necessary to provide a short circuit and the appropriate structure for the short circuit for the interlocking-function alone. As a result, the structure becomes complex and leads to an increase in the cost, for example, of various parts.

SUMMARY

In view of the circumstances described above, the present invention aims to provide a simplified power converter with a low cost interlocking-function.

A mode of the present invention is a power converter including a case body provided with a device main body part having a power conversion part accommodated, a lid covering the aperture of the case body, a first substrate fixed to the case body, a second substrate fixed to the lid, the first substrate and the second substrate fixed, and a connection member electrically connecting the first substrate and the second substrate.

The power converter includes the first substrate fixed to the case body, and the second substrate fixed to the lid. The connection member is fixed to the first substrate and the second substrate. In other words, when the lid member is removed from the case body the connection member is detached from either the first substrate or the second substrate, or the connection member itself is fractured (i.e., electrically disconnected), as a result, the electrical-connection between the first substrate and second substrate is shut-off through the connection member. The interlock-function is thus performed and the electricity supply to the power converter shut-off.

The connection member is for electrically connecting the first substrate and the second substrate, and it is not necessary to provide a device having an exclusive interlocking-function. That is, in the mode described herein, the connection member necessary for the electrical connection of the first substrate and the second substrate can also be used as an interlocking-function. As a result, a simplified power converter and a low cost interlocking-function can be provided.

According to the mode described herein, the simplified power converter having a low cost interlocking-function can be provided.

BRIEF DESCRIPTION OF THE DRAWINGS

In the accompanying drawings:

FIG. 7 shows connection members each having a thinner part formed (groove) as a lower strength and shows an explanatory view of a state when the connection members are fractured at the lower strength part.

DETAILED DESCRIPTION OF THE PREFERRED EMBODIMENTS (First Embodiment)

The embodiments for a power converter will be described with reference to FIGS. 1 to 4.

Figure 1:
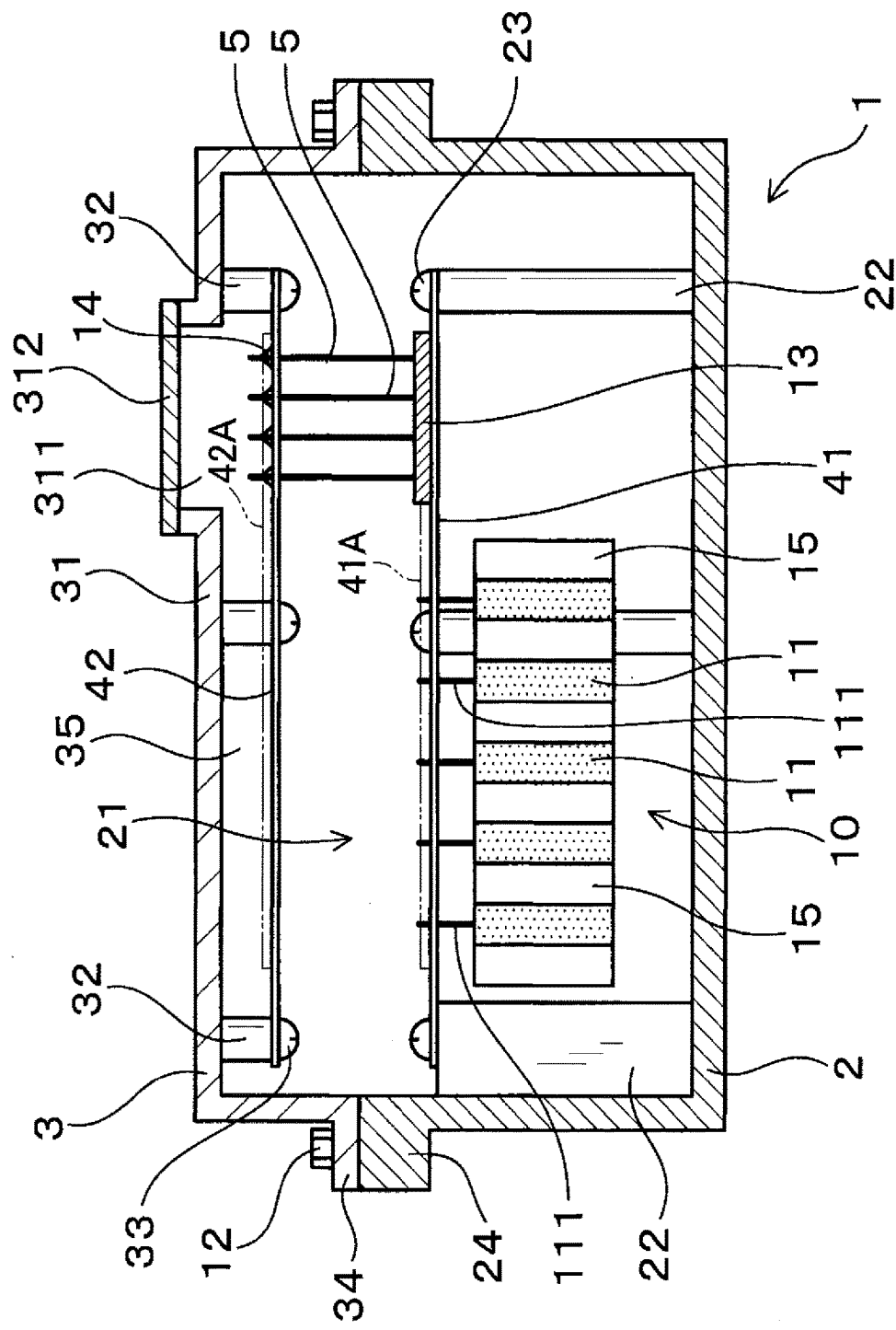
FIG. 1 shows a cross sectional view of a power converter according to the first embodiment.

As shown in FIG. 1, the power converter includes a case body 2, a lid 3, a first substrate 41 fixed to the case body 2, a second substrate fixed to the lid 3 and a connection member 5.

The case body 2 accommodates a device main part 10 provided with a power conversion part, and is provided with an aperture 21. The lid 3 covers the aperture 21 of the case body 2. The connection member 5 fixes the first substrate 41 and the second substrate 42 and electrically connects the first substrate 41 and the second substrate 42.

The power converter 1 according to the first embodiment can be used, for example, as an inverter mounted in an electric vehicle and a hybrid vehicle. The power converter 1 is formed to perform the conversion of power, for example, between a direct current and an alternating current.

Inside the case body 2, there are a plurality of bosses 22 provided to fix the first substrate 41. The first substrate 41 is fastened with a screw 23 in relation to the plurality of bosses 22. As a result, the first substrate 41 is fixed to the case body 2. The first substrate 41 is arranged such that a normal direction of the first substrate 41 faces the opening direction of the aperture 21 of the case body.

On the inside of the lid 3, there are another plurality of bosses 32 provided to fix the second substrate 42. The second substrate is screw fixed by a screw 33, with respect to the plurality of bosses 32. As a result, the second substrate 42 is fixed to the lid. In the present embodiment, the lid 3 has a hollow concave space 35 on the opposing side of the case body 2. The plurality of bosses 32 are formed in the concave space 35 and the second substrate 42 is arranged therein. More specifically, the second substrate 42 is arranged such that, the normal direction of the second substrate 42 is in the opposing direction of the case body 2. The second substrate 42 is positioned parallel to a top 31 of the lid 3.

Figure 2:
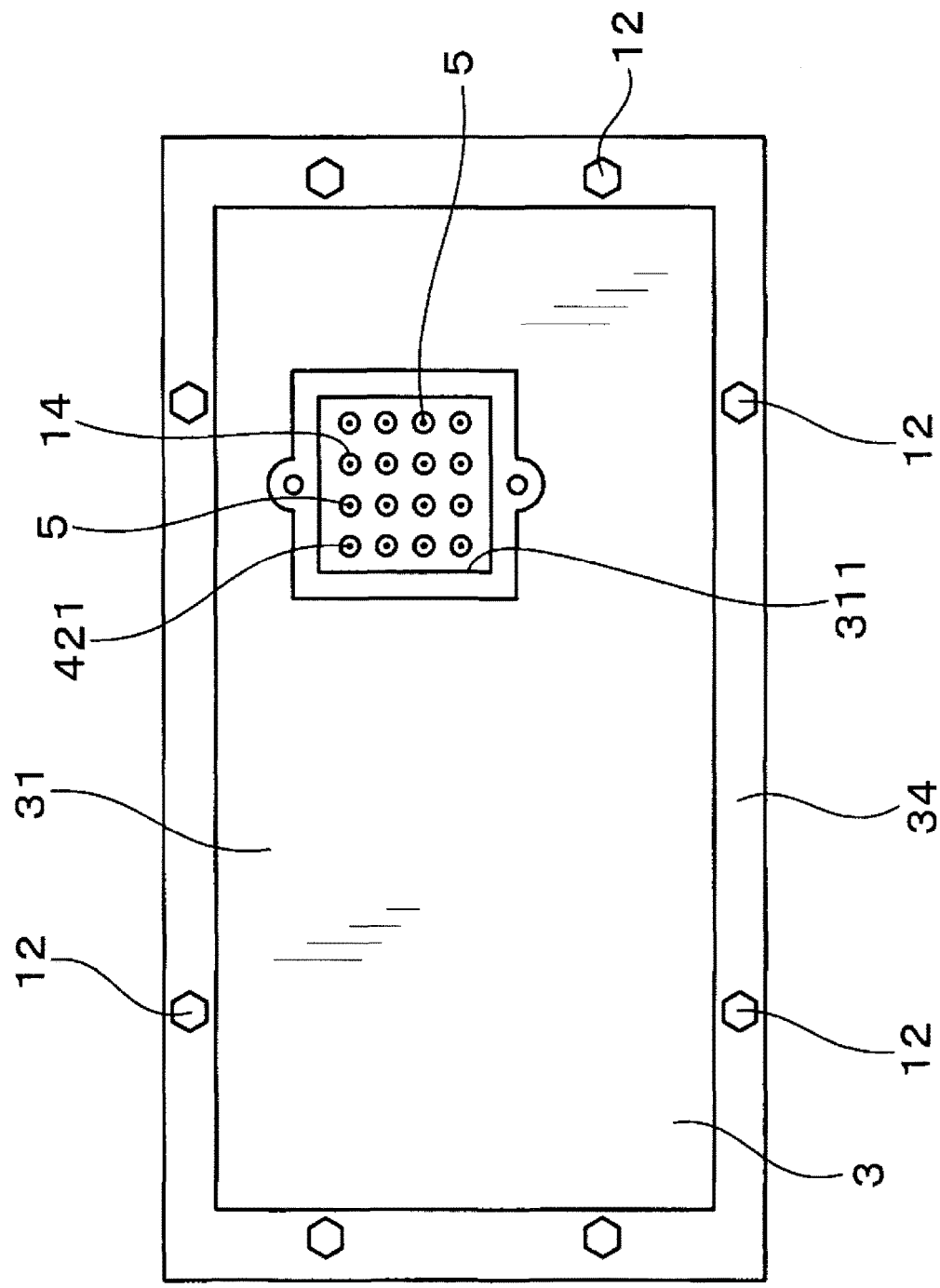
FIG. 2 shows a plan view of the power converter according to the first embodiment.

The case body 2 and the lid 3 are both made of metal. The case body 2 has a flange member 24 on the peripheral of the aperture 21. As shown in FIG. 1 and FIG. 2, the case body 2 and the lid 3 are fixed by the screw 12 in a plurality of positions on the flange parts 24 and 34 which are overlapping each other.

As shown in FIG. 1, the first substrate 41 and the second substrate 42 are arranged opposite each other and are also parallel to each other. Additionally, the connection member 5 electrically connecting the first substrate 41 and the second substrate 42 is positioned upright in the normal direction of the first substrate 41 and second substrate 42. In the present embodiment, the connection member 5 is a lead-pin formed to project from the first substrate 41 connecting with the second substrate 42. Note, the connection member 5, that is the lead pin, can also be formed to project from the second substrate 42 connecting with the first substrate 41. In other words, the connection member 5 can be a lead pin (or an electrical connection material) projected from either the first substrate 41 or the second substrate 24, connecting the other substrate therein.

Figure 3:
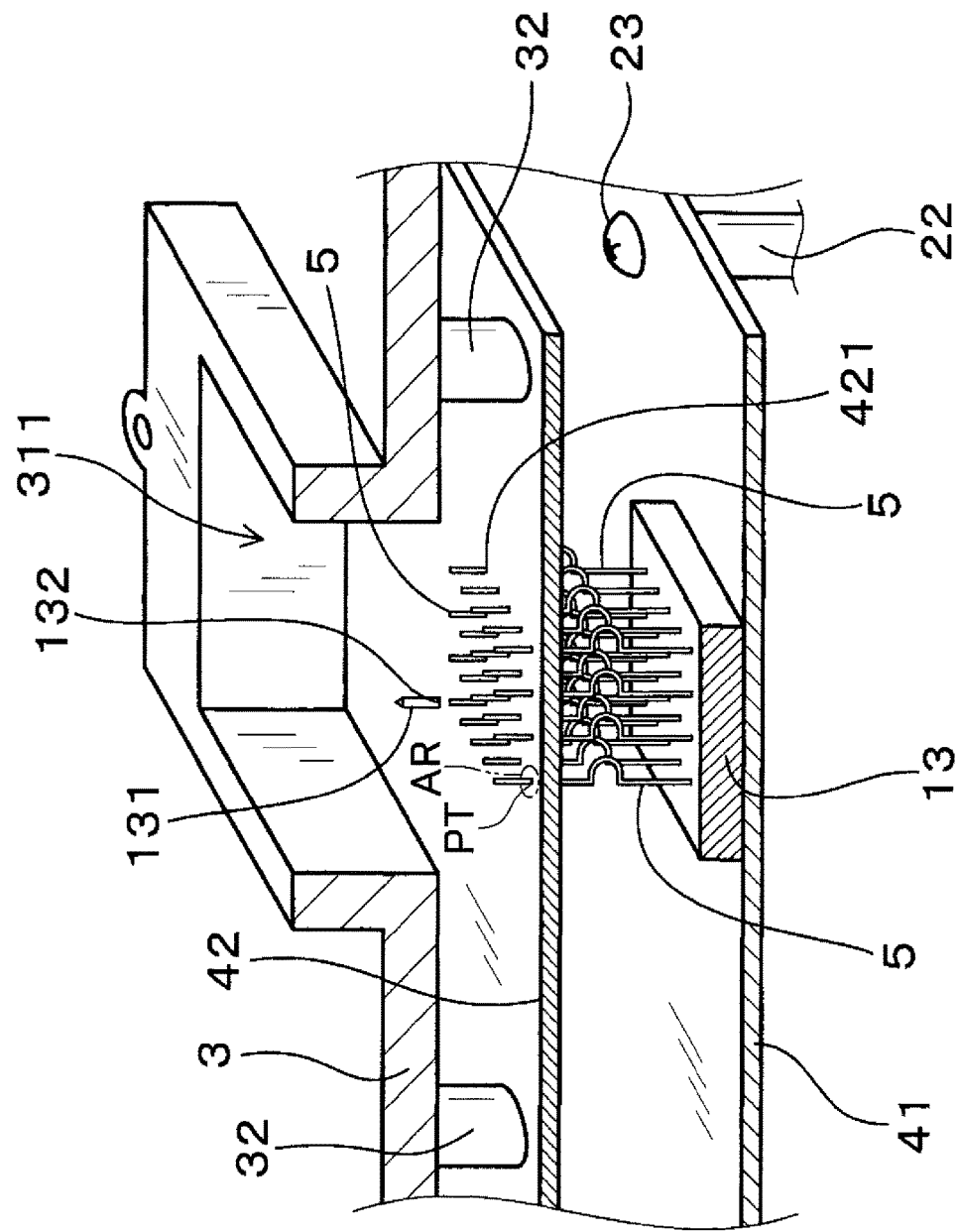
FIG. 3 shows part of a perspective view of the surrounding area of a connection member according to the first embodiment.

More specifically, as shown in FIG. 1 and FIG. 3, the connection member 5 is the lead pin projected from a mounting portion 13 mounted on the first substrate 41. Note, projection of the lead pin from the first substrate 41 includes projection from, for example, the mounting portion fixed to the first substrate 41.

The lead pin which is the connection member 5 is inserted in a through-hole 421 provided on the second substrate 42. The connection member 5 is connected to a land pattern surrounding the through-hole 421 of the second substrate 42 by a soldered part 14. The soldered part 14 refers to the raised part of the solder melted to form the solder part 14. The connection member 5 is thus electrically connected and also fixed to the second substrate 42.

The mounting member 13 is electrically connected to the first substrate 41 and fixed. As a result, the connection member 5 is fixed to both the first substrate 41 and the second substrate 42, and electrically connects the substrates therein. Additionally, the connection member 5 is arranged in a plurality. The plurality of connection members 5 are positioned upright parallel from each other.

As shown in FIG. 1, a plurality of semiconductor modules 11 forming a part of the device main body 10 are accommodated in the case body 2. The device main body part 10 includes an inbuilt semiconductor module 11 used as a switching element, for example, of an Insulated-gate bipolar transistor (IGBT) and Metal-oxide semiconductor field-effect transistor (MOSFET). A control terminal 111 of the semiconductor 11 is connected to the first substrate 41. The plurality of semiconductors 11 are arranged on the opposing side of the second substrate 42 between the first substrate 41. The plurality of semi-conductor modules 11 are layered between a plurality of cooling tubes 15. The plurality of semiconductors 11 are thus arranged to provide heat radiation from both surfaces. In the case body 2, other than the first substrate 41 and semiconductor 11, there is also, for example, a capacitor, a reactor and other various electronic parts accommodated therein, that are not shown in the Figs, included in the device main body part 10. Note, the device main body part 10 is not particularly limited to the above described, A high voltage-circuit is mounted on the first substrate 41, whereas a low-voltage circuit is mounted on the second substrate 42. The high-voltage circuit mounted on the first substrate 41 is formed as a driving circuit 41A to perform switching operations of switching elements in the semiconductor module 11, The low-voltage circuit mounted on the second substrate 42 is formed as a control circuit 42A controlling the driving circuit 41A based on signals output from each of various sensors (not shown in the figures). Such sensors sense information indicative of operated states of an inverter mounted on a vehicle, for example. The semiconductor modules 11 have, respectively, control terminals 111 electrically connected to the driving circuit.

In the present embodiment, the mounting member 13 provided with the connection members 5 is a portion in which the plurality of connection members 5 are partially resin-molded. A current outputted from the control circuit 42A of the second substrate 42 is transmitted to the first substrate 41-side via the connection member 5 of the mounting member 13. The control circuit 42A is formed such that an electric signal outputted from the control circuit 42A is transmitted to the driving circuit 41A via the photo-coupler (not shown) mounted on the first substrate 41. That is, the control circuit 42A which is the low-voltage circuit and the driving circuit 41A which is the high-voltage circuit are electrically insulated by the photo-coupler.

As shown in FIG. 3, a position-hole pin 131 is positioned upright in the position adjacent to the plurality of connection members 5. That is, the position-hole pin 131 is arranged in an upright position towards the second substrate 42 from the first substrate 41, and inserted in a position-hole 132 provided on the second substrate. As a result, positioning of the first substrate 41 and the second substrate 42 can be easily performed, and the plurality of connection members 5 can be easily inserted in the plurality of through-holes 421 of the second substrate 42. For the present embodiment, the position-hole pin 131 is projecting from part of the mounting member 13. Note, for the first embodiment, the position-hole pin 131 has been shown as a single position-hole pin, however, 2 position-hole pins are preferable.

As shown in FIG. 1 to FIG. 3, on the top 31 of the lid member 3, an opening that is an opening-window 311 is formed in the direction of the plurality of through-holes 421 of the second substrate. That is, the opening window 311 opens towards the region where the plurality of connection members 5 are positioned, The opening window 311 is covered by a small lid 312 attached to the top 31 by a screw (not shown in the Figs.).

The connection member 5 is formed such that when the lid member 3 is removed from the case body 2, either the first substrate 41 or the second substrate 42 is detachable.

Figure 4:
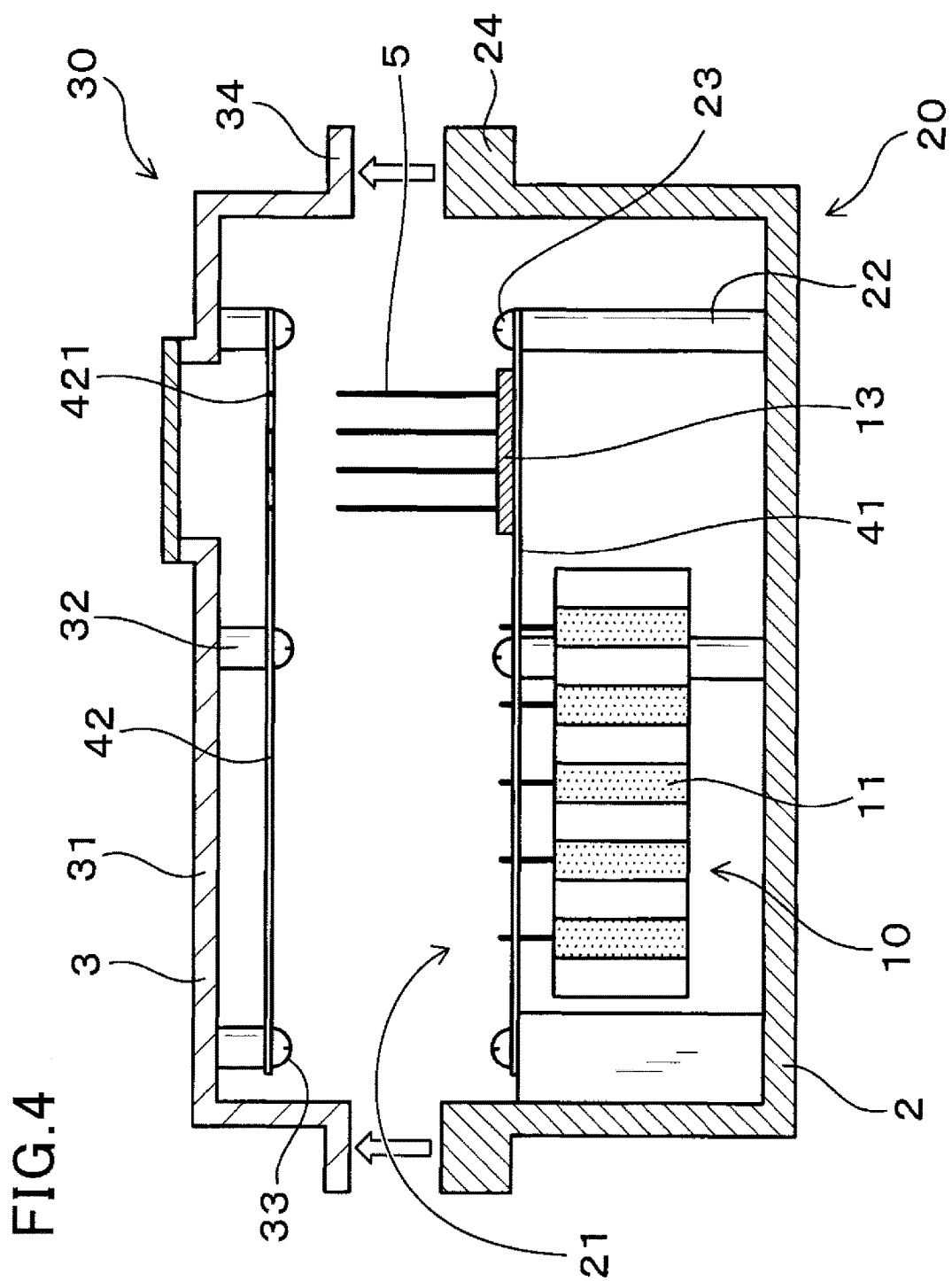
FIG. 4 shows a cross sectional explanatory view of a state when a lid is removed from a case body according to the first embodiment.

Also, according to the first embodiment, the connection member 5 is arranged such that when the lid member 3 is removed from the case body 2 the connection member 5 is detachable from the second substrate 42, as shown in FIG. 4. That is, the connection member 5 and the second substrate 42 are detachable from the soldered part 14 which connects both the connection member 5 and the second substrate 42 (refer to FIG. 1).

As shown in FIG. 4, the first substrate 41 is fixed to the case body 2 and integrated therein. On the other hand, the second substrate 42 is fixed to the lid member 3 and integrated therein. When the lid member 3 is removed from the case body 2 and moved in a direction away from the case body 2, the second substrate 42 will thus be subjected to a move in the direction away from the first substrate 41. At this point, stress is working on the connection member 5 fixed to the first substrate 41 and the second substrate 42, a fixing member of the connection member 5 and the first substrate 41, and a fixing member of the connection member 5 and the second substrate 42. In this embodiment, the soldered part 14 which is the fixing member of the connection member 5 and the second substrate 42 is the member that has lowest strength among the members described above, The connection member 5 is detachable from the second substrate 42 in relation with the soldered part 14.

Next, an assembly method for the power converter 1 is described below.

The components for the device main body part 10, for example, the semiconductor module 11 is fixed to the case body 2, in addition to the first substrate 41. The main body unit 20 is thus formed (see FIG. 4). At this point, the connection member 5 is provided on the main body unit 20, whereas a lid unit 30 is formed by fixing the second substrate 42 to the lid member 3 (refer to FIG. 4).

As shown in FIG. 1 and FIG. 2, the lid unit 30 is mounted on the main body unit 20 to cover the aperture 21 of the case body 2. At this point, the connection member 5 provided on the main body unit 20 is inserted in the through-hole 421 of the second substrate 42. More specifically, once an expanding direction of the first substrate 41 and the second substrate 42 is determined, the plurality of connection members 5 can be inserted into the plurality of through-holes 421 by inserting the position-hole pin 131 (refer to FIG. 3) projected from the first substrate 41 onto the position-hole 132 of the second substrate 42.

Next, with regards to flanges 24 and 34, the lid member 3 is fixed to the case body 2 by fastening the screw 12. Subsequently, soldering between the connection member 5 and the second substrate 42 is performed from the opening-window 311 of the lid member 3. The small lid 312 is attached to the lid member 3 covering the opening-window 311. The power converter 1 is assembled as described above.

Next, action and effect of the first embodiment are described. The power converter 1 includes the first substrate 41 fixed to the case body 2 and the second substrate 42 fixed to the lid member 3. The connecting member 5 is fixed to both the first substrate 41 and the second substrate 42. When the lid member 3 is removed from the case body 2, the first substrate 41 and the second substrate 42 is thus fractured, i.e., electrically disconnected, through the connection member 5. As a result, the electric supply to the power converter 1 can be terminated using the interlock function.

In an example, when the electrical connection between the first substrate and the second substrate is fractured, the current between the first substrate 41 and the second substrate 42 is shut-off. As a result, since a controller detects the shut-off between the first substrate 41 and the second substrate 42, the power supply (from the power source) to the power converter 1 can be shut-off accordingly. That is, when the controller detects that the signal (current) between the first substrate 41 and the second substrate 42 is shut-off, a system main relay provided between the power source and the power converter device 1 is shut-off. Alternatively, in addition to intercepting the system main relay, the power converter 1 may also be formed such that the device is shut-down by switching off all the switching elements of the semiconductor module.

The connection member 5 provides the electrical-connection between the first substrate 41 and the second substrate 42, where there is no need to provide a specific interlocking-function. In other words, in the power converter 1 described herein, the connection member 5 initially used for electrically connecting the first substrate 41 and the second substrate 42, can also be used as an interlocking function when the case body 2 and the lid member 3 is removed. As a result, a simple converter with a low-cost interlocking-function can be provided.

In addition, the connection member 5 is formed such that the second substrate 42 is detachable when the lid member 3 is taken from the case body 2. As a result, the interlocking function can be performed smoothly, and damage, for example, to the first substrate 41 and the second substrate 42 is suppressible. Also, the connection member 5 is formed from the lead pin to facilitate the shut-off of the electrical connection between the first substrate 41 and the second substrate 42, of which can be easily performed.

The high voltage-circuit is mounted on the first substrate 41, whereas the low-voltage circuit is mounted on the second substrate. That is, since the second substrate 42 fixed to the lid member 3 is a substrate having a low-voltage circuit, the power converter 1 can be formed such that the device easily assembled. As described above, in providing the opening window 311 on the lid member 3, the connection between the connecting member 5 and the second substrate 42 can be achieved. Hypothetically, if the second substrate includes the high-voltage circuit then it is difficult to provide the opening-window 311 thereon. Also, when the lead-pin is provided as the connection member 5 on the second substrate 42, it is also difficult to form the power converter 1. If however, the low-voltage circuit is mounted on the second substrate 42, the assembly of the power converter 1 can be easily performed.

As described above, according to the first embodiment, the power converter with a simple interlocking-function that is achieved at a low cost can be provided.

(The Second Embodiment)

Figure 5:
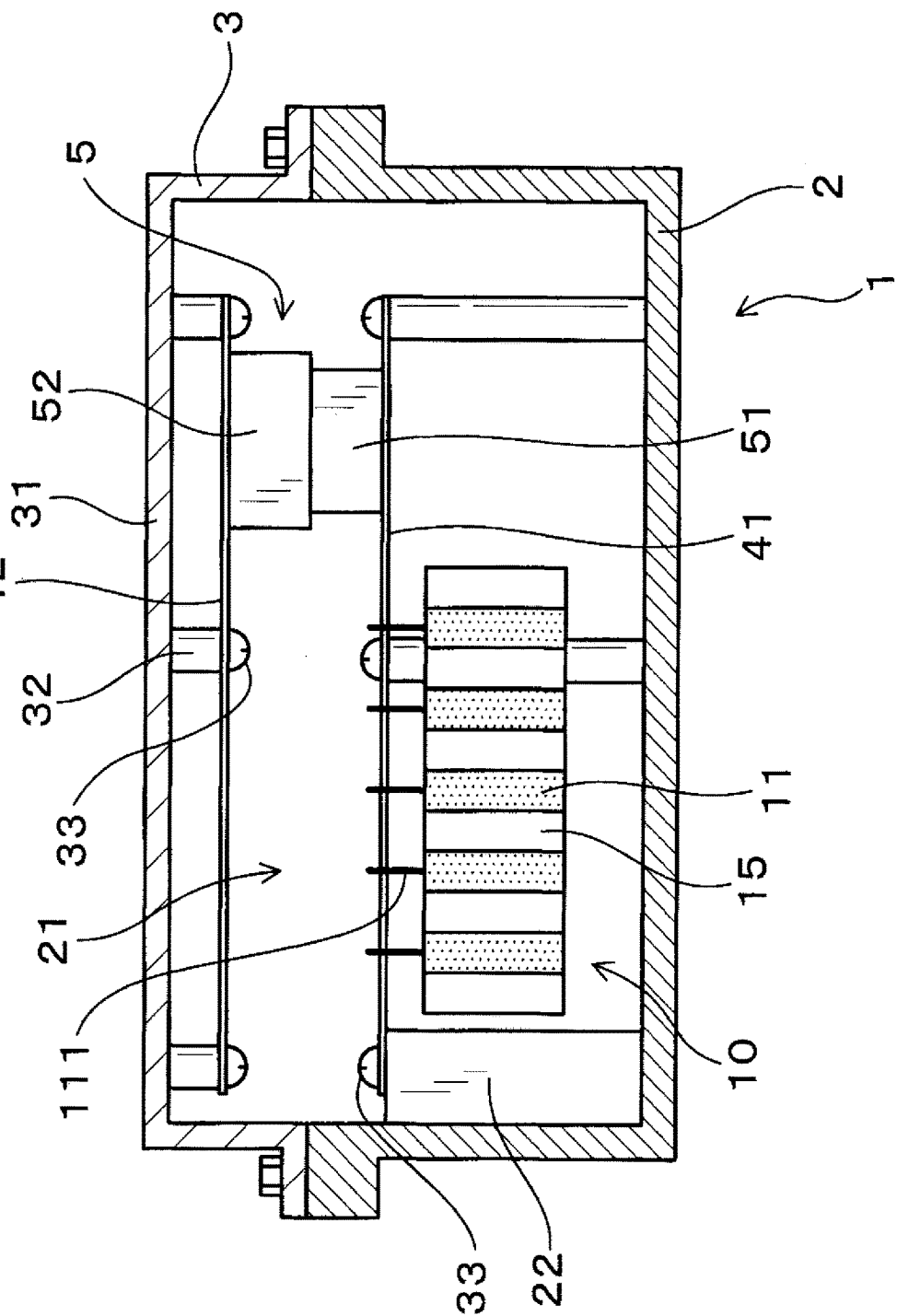
FIG. 5 shows a cross sectional explanatory view of the power converter according to the first embodiment.
Figure 6:
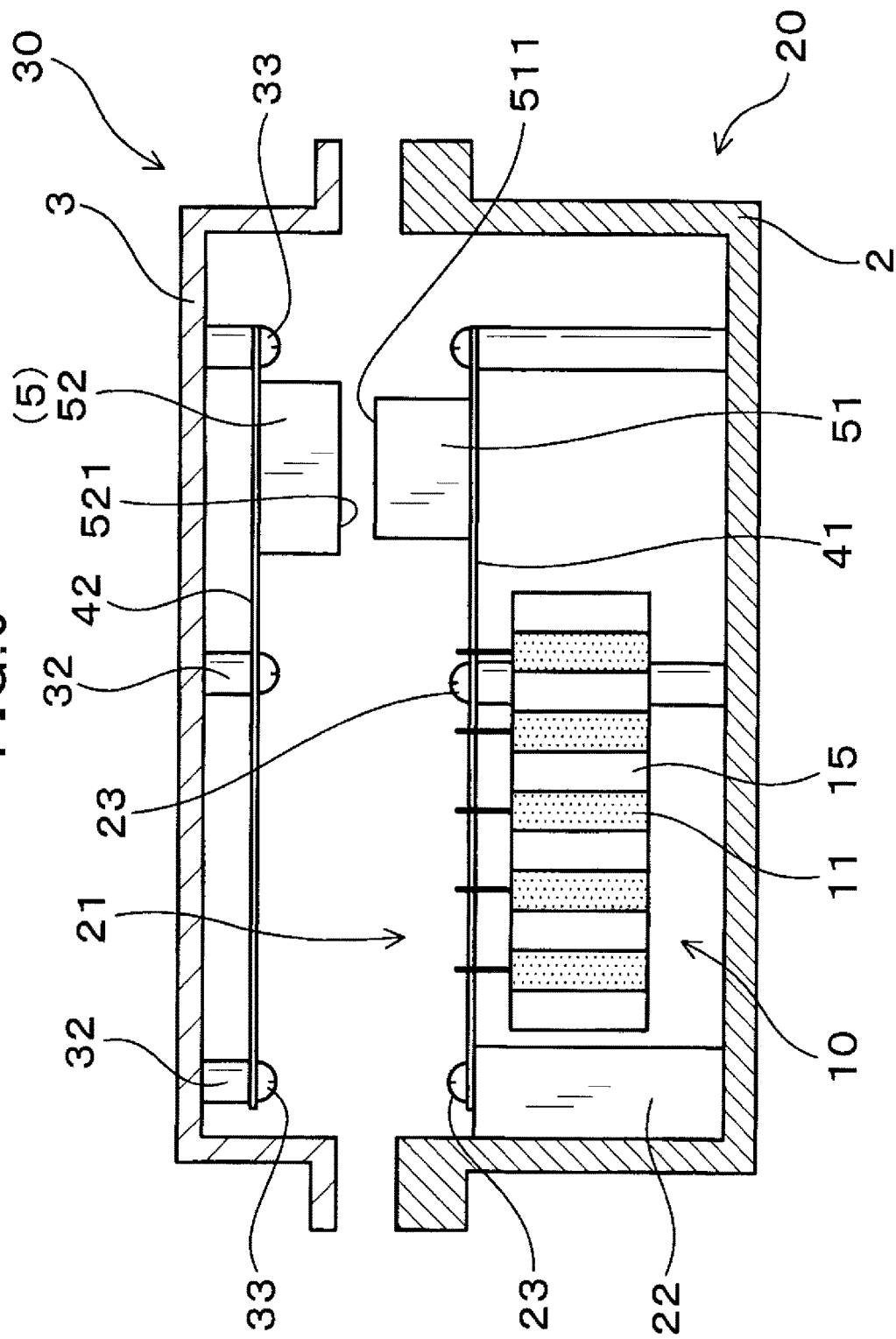
FIG. 6 shows a cross sectional explanatory view of the state when the lid is removed from the case body according to the second embodiment.

The power converter 1 according to the second embodiment, as shown in FIG. 5 and FIG. 6, includes a connector corresponding with the connection member 5. In other words, the connection member 5 is formed of a first connector 51 attached to the first substrate 41, and a second connector 52 attached to the second substrate 42. The first connector 51 and the second connector 52 are fixed thereon in a detachable manner from each other.

The first connector 51 is mounted on a surface of the first substrate 41 that is on the opposing side of the second substrate 42, and fixed therein. The first connector 51 is arranged such that a connector terminal 511 is facing the second substrate 42-side. The second connector 52 is mounted on the surface of the second substrate 42 that is, on the opposing side of the first substrate 41, and fixed therein. Also, the second connector 52 is arranged such that a connector terminal 521 is facing the first substrate 41-side. As a result, the first connector 51 and the second connector 52 are in an opposing direction of the first substrate 41 and the second substrate 42. That is, the first connector 51 and the second connector 52 are arranged in a direction of the case body 2 and the lid body 3, respectively, such that either one is detachable from each other.

The connection member 5, as shown in FIG. 6, is formed such that when the lid member 3 is removed from the case body 2 it is fractured, i.e., electrically disconnected. That is, if the lid member 3 is removed from the case body 2, the fitting between the first connector 51 and the second connector 52 is released. The other aspects of the second embodiment are the same as those described in the first embodiment. Note, for the second embodiment described herein, the same symbols can be used for the parts that have the same parts and function as the first embodiment.

In the second embodiment, when the lid member 3 is removed from the case body 2 the connection member 5 is fractured. As a result, damage to the first substrate 41 and the second substrate 42 is avoided, the electrical connection between the first substrate 41 the second substrate 42 is shut-off easily, and the interlocking-function can be used.

Additionally, since the connection member 5 is formed from the first connector 51 and the second connector 52, when the lid member 3 is removed from the case body 2, the electrical connection between the first substrate 41 the second substrate 42 is smoothly shut-off, as the fitting between the first connector 51 and the second connector 52 is released. Furthermore, after the lid member 3 is fixed to the case body 2, there is no need to provide an opening-window on the lid member 3 (refer to FIG. 1, symbol 311) since it is not necessary, for example, to solder the connection member 5 on to the substrate 2. As a result, the simplified power converter 1 can be provided. The other effects and actions are as described in the first embodiment.

The embodiments of the present invention are not limited to the embodiments described herein and can be modified accordingly without departing from the scope of the invention.

For example, in the first embodiment, when the lid member 3 is removed from the case body 2, the connection members 5 formed as the lead-pins may be provided such that the connection member 5 itself is divided into parts. That is, the lead pins forming the connection members 5 according to the first embodiment may be provided such that each of the lead-pins is formed to have a weak point WP in strength in its axial direction, whereby the lead-pins are dividable into two pieces. FIG. 7 shows an example of this dividable configuration.

In the configuration shown in FIG. 7, as shown in FIG. 7 (A), each of the connection members 5 includes a thin part formed (groove) beforehand as a part having a lower strength WP. For this reason, as shown in the FIG. 7 (B) each of the connection members 5 is fractured, i.e., disconnected, at the thin part formed WP and the same effect as the described embodiments above is elicited.

In a further example, in either the first embodiment or the second embodiment, a relatively low-strength part may be provided at a peripheral part AR around a spot PT at which an end of the connection member 5 is fixed. As a result, due to a lower strength of such parts, these parts can easily be positively fractured from the second substrate 42, whereby the foregoing detachment effect can be obtained as well.

In addition, for the embodiments described herein, an inverter is shown, however the power converter according to the present invention is not limited to the inverter. That is, for example, another power converter can be implemented, for example, a DC-DC converter.

REFERENCE SIGN LIST 1 power converter, 10 device main body part, 2 case body, 21 aperture, 3 lid member, 41 first substrate, 42 second substrate, 5 connection member.

What is claimed is:

1. A power converter comprising:
a case body provided with a device main body having a power conversion part accommodated therein and an aperture;
a lid member which covers the aperture of the case body;
a first substrate fixed to the case body;
a second substrate fixed to the lid member; and
a connection member detachably fixed on the first and second substrates so as to electrically connect the first substrate and the second substrate, wherein
the lid member is provided with an opening window which is opened to an outside and an inside of the lid member such that connection between the second substrate and the connection member is enabled from the outside of the case body through the opening window, after the lid member is made to cover the aperture of the case body.

2. The power converter according to claim 1, wherein the connection member is configured to be removed from either the first substrate or the second substrate when the lid member is removed from the case body.

3. The power converter according to claim 2, wherein the connection member is configured such that electrical conduction through the connection member is shut off when the lid member is taken from the case body, and the connection member is fractured so as to be electrically disconnected.

4. The power converter according to claim 2, wherein the first substrate has a high-voltage circuit mounted thereon and the second substrate has a low-voltage circuit mounted thereon, the high-voltage and low-voltage circuits being for power conversion performed by the power conversion part.

5. The power converter according to claim 1, wherein the connection member is configured such that electrical conduction through the connection member is shut off when the lid member is taken from the case body, and the connection member is fractured so as to be electrically disconnected.

6. The power converter according to claim 5, wherein the connection member has a lower-strength part such that the lower-strength part is fractured when the lid member is taken from the case body.

7. The power converter according to claim 6, wherein the first substrate has a high-voltage circuit mounted thereon and the second substrate has a low-voltage circuit mounted thereon, the high-voltage and low-voltage circuits being for power conversion performed by the power conversion part.

8. The power converter according to claim 5, wherein either one of the first and second substrates has a lower-strength part around a spot at which an end of the connection member is connected, such that the lower-strength part is deliberately fractured when the lid member is taken from the case body.

9. The power converter according to claim 8, wherein the first substrate has a high-voltage circuit mounted thereon and the second substrate has a low-voltage circuit mounted thereon, the high-voltage and low-voltage circuits being for power conversion performed by the power conversion part.

10. The power converter according to claim 5, wherein the first substrate has a high-voltage circuit mounted thereon and the second substrate has a low-voltage circuit mounted thereon, the high-voltage and low-voltage circuits being for power conversion performed by the power conversion part.

11. The power converter according to claim 1, wherein the first substrate has a high-voltage circuit mounted thereon and the second substrate has a low-voltage circuit mounted thereon, the high-voltage and low-voltage circuits being for power conversion performed by the power conversion part.

12. The power converter according to claim 1, wherein the lid member is provided with the opening member directly opposed to the connection member.

13. The power converter according to claim 12, wherein the connection member is provided in plurality and the plurality of connection members are disposed two dimensionally on the first substrate.

* * * * *